(12) United States Patent
Park et al.

(10) Patent No.: US 9,620,613 B2
(45) Date of Patent: Apr. 11, 2017

(54) ORGANIC LIGHT EMITTING DISPLAY DEVICES AND METHODS OF MANUFACTURING ORGANIC LIGHT EMITTING DISPLAY DEVICES

(71) Applicant: Samsung Display Co., Ltd., Yongin, Gyeonggi-Do (KR)

(72) Inventors: Sang-Ho Park, Suwon-si (KR);
Jae-Hyuk Jang, Seongnam-si (KR);
Chang-Ok Kim, Yongin-si (KR);
Joo-Sun Yoon, Seoul (KR); Yong-Jae Jang, Seoul (KR)

(73) Assignee: Samsung Display Co., Ltd. (KR)

(*) Notice: Subject to any disclaimer, the term of this patent is extended or adjusted under 35 U.S.C. 154(b) by 0 days.

(21) Appl. No.: 14/721,952

(22) Filed: May 26, 2015

(65) Prior Publication Data
US 2016/0020266 A1 Jan. 21, 2016

(30) Foreign Application Priority Data

Jul. 18, 2014 (KR) .................. 10-2014-0090714

(51) Int. Cl.
| H01L 27/32 | (2006.01) |
| H01L 21/02 | (2006.01) |
| H01L 27/12 | (2006.01) |
| H01L 29/49 | (2006.01) |
| H01L 29/51 | (2006.01) |

(Continued)

(52) U.S. Cl.
CPC ........ *H01L 29/518* (2013.01); *H01L 27/1259* (2013.01); *H01L 27/326* (2013.01); *H01L 27/3262* (2013.01); *H01L 27/3265* (2013.01); *H01L 29/4908* (2013.01); *H01L 27/3258* (2013.01)

(58) Field of Classification Search
CPC ............ H01L 27/326; H01L 27/3262; H01L 27/1214; H01L 29/4908; H01L 27/3265; H01L 27/1255; H01L 27/1259; H01L 27/3258; H01L 29/518
See application file for complete search history.

(56) References Cited

U.S. PATENT DOCUMENTS

| 5,928,732 A * | 7/1999 | Law ................. C23C 16/308 |
| | | 257/E21.268 |
| 7,435,992 B2 * | 10/2008 | Choi ................. G09G 3/3233 |
| | | 257/72 |

(Continued)

FOREIGN PATENT DOCUMENTS

| KR | 1020120002759 A | 1/2012 |
| KR | 1020120129592 A | 11/2012 |
| KR | 1020140039840 A | 4/2014 |

*Primary Examiner* — Khiem D Nguyen
*Assistant Examiner* — Pauline Vu
(74) *Attorney, Agent, or Firm* — Innovation Counsel LLP

(57) ABSTRACT

An organic light emitting display device includes a substrate, a first transistor disposed on the substrate in the opaque region, a second transistor disposed on the substrate in the opaque region, the second transistor being adjacent to the first transistor along a first direction, and a capacitor disposed on the substrate in the opaque region, the capacitor being adjacent to the first transistor along a second direction different from the first direction. Here, the capacitor may include a first capacitor electrode, a dielectric structure including silicon oxynitride and a second capacitor electrode.

15 Claims, 10 Drawing Sheets

(51) Int. Cl.
*H01L 49/02* (2006.01)
*H01L 51/56* (2006.01)

(56) References Cited

U.S. PATENT DOCUMENTS

| | | | | |
|---|---|---|---|---|
| 2002/0102776 | A1* | 8/2002 | Yamazaki | H01L 27/12 438/149 |
| 2003/0082889 | A1* | 5/2003 | Maruyama | H01L 27/1214 438/455 |
| 2003/0111666 | A1* | 6/2003 | Nishi | H01L 51/0051 257/79 |
| 2003/0111954 | A1* | 6/2003 | Koo | H01L 27/3276 313/498 |
| 2003/0117059 | A1* | 6/2003 | Koo | H01L 27/3265 313/422 |
| 2003/0117352 | A1* | 6/2003 | Kimura | G09G 3/3233 345/87 |
| 2003/0127652 | A1* | 7/2003 | Park | H01L 27/3244 257/72 |
| 2003/0193284 | A1* | 10/2003 | Park | H01L 27/3244 313/504 |
| 2004/0012028 | A1* | 1/2004 | Park | H01L 27/3244 257/88 |
| 2004/0090173 | A1* | 5/2004 | Park | H01L 27/3253 313/500 |
| 2005/0029593 | A1* | 2/2005 | Kudo | H01L 29/66757 257/347 |
| 2005/0099369 | A1* | 5/2005 | Lee | H01L 27/3279 345/76 |
| 2005/0212447 | A1* | 9/2005 | Oh | H01L 27/3246 315/169.3 |
| 2006/0091399 | A1* | 5/2006 | Lee | H01L 27/12 257/72 |
| 2007/0024181 | A1* | 2/2007 | Oh | H01L 27/3258 313/500 |
| 2007/0138478 | A1* | 6/2007 | Son | H01L 27/3276 257/72 |
| 2007/0159077 | A1* | 7/2007 | Kim | H01L 27/3265 313/504 |
| 2008/0067932 | A1* | 3/2008 | Baek | H01L 27/3223 313/509 |
| 2009/0047774 | A1* | 2/2009 | Yamazaki | C23C 16/509 438/479 |
| 2011/0084281 | A1* | 4/2011 | Koyama | G09G 3/3241 257/59 |
| 2011/0108844 | A1* | 5/2011 | Kwak | G09G 3/3233 257/71 |
| 2011/0108848 | A1* | 5/2011 | Lee | H01L 27/3262 257/72 |
| 2011/0147770 | A1* | 6/2011 | Hwang | H01L 27/326 257/89 |
| 2011/0163664 | A1* | 7/2011 | Kang | H01L 27/3232 313/504 |
| 2011/0204369 | A1* | 8/2011 | Ha | H01L 51/5228 257/59 |
| 2011/0241014 | A1* | 10/2011 | Yoon | H01L 27/3276 257/72 |
| 2011/0303922 | A1* | 12/2011 | Cho | H01L 27/1248 257/71 |
| 2012/0001191 | A1* | 1/2012 | Ma | G02F 1/136213 257/71 |
| 2012/0153286 | A1* | 6/2012 | Yoon | B82Y 10/00 257/59 |
| 2012/0267611 | A1* | 10/2012 | Chung | H01L 27/3211 257/40 |
| 2012/0292612 | A1* | 11/2012 | Jeong | H01L 27/1225 257/43 |
| 2012/0326151 | A1* | 12/2012 | Zhan | H01L 27/1255 257/59 |
| 2013/0175514 | A1* | 7/2013 | Han | H01L 27/3213 257/40 |
| 2013/0187131 | A1* | 7/2013 | Chung | H01L 27/326 257/40 |
| 2013/0328022 | A1 | 12/2013 | Choi et al. | |
| 2014/0084264 | A1* | 3/2014 | Lee | H01L 27/124 257/40 |
| 2014/0117323 | A1* | 5/2014 | Ahn | H01L 27/1288 257/40 |
| 2014/0175396 | A1* | 6/2014 | Lee | H01L 51/56 257/40 |
| 2014/0239270 | A1* | 8/2014 | Ko | H01L 27/1255 257/40 |

\* cited by examiner

ORGANIC LIGHT EMITTING DISPLAY DEVICES AND METHODS OF MANUFACTURING ORGANIC LIGHT EMITTING DISPLAY DEVICES

CROSS-REFERENCE TO RELATED APPLICATION(S)

This application claims priority under 35 U.S.C. §119 to Korean patent Application No. 10-2014-0090714, filed on Jul. 18, 2014, the disclosure of which is hereby incorporated by reference herein in its entirety.

BACKGROUND

1. Technical Field

Example embodiments relate to organic light emitting display devices and methods of manufacturing organic light emitting display devices. More particularly, example embodiments relate to organic light emitting display devices including at least one capacitor having a dielectric structure containing silicon oxynitride, and methods of manufacturing the organic light emitting display devices.

2. Description of the Related Art

Recently, a transparent organic light emitting display device has been rapidly developed. The transparent organic light emitting display device may include a transparent region and an opaque region. In the transparent organic light emitting display device, an image of an object before or after a transparent region of the organic light emitting display device may be recognized when the organic light emitting display device is in an ON state. In an OFF state of the organic light emitting display device, an image may be displayed in a pixel region of the organic light emitting display device.

In the conventional transparent organic light emitting display device, since transistors and capacitors are positioned in the opaque region, an area of the transparent region may not be sufficiently obtained, and the capacitor may not provide a sufficient capacitance for other elements of the organic light emitting display device.

SUMMARY

Example embodiments provide an organic light emitting display device including a capacitor having a dielectric structure containing silicon oxynitride.

Example embodiments provide a method of manufacturing an organic light emitting display device including a capacitor having a dielectric structure containing silicon oxynitride.

According to one embodiment, there is provided an organic light emitting display device having an opaque region and a transparent region. The organic light emitting display device may include a substrate, a first transistor disposed on the substrate in the opaque region, a second transistor disposed on the substrate in the opaque region, the second transistor being adjacent to the first transistor along a first direction, and a capacitor disposed on the substrate in the opaque region, the capacitor being adjacent to the first transistor along a second direction different from the first direction. Here, the capacitor may include a first capacitor electrode, a dielectric structure including silicon oxynitride and a second capacitor electrode.

In example embodiments, the first transistor may include a first active pattern disposed on the substrate in the opaque region, a first gate insulation layer disposed on the first active pattern, the first gate insulation layer extending into the transparent region, a second gate insulation layer including silicon oxynitride disposed on the first gate insulation layer, the second gate insulation layer extending into the transparent region, a first gate electrode disposed on the second gate insulation layer, a first source electrode contacting the first active pattern, the first source electrode extending along the second direction, and a first drain electrode contacting the first active pattern.

In example embodiments, a dielectric constant of the second gate insulation layer and a refractive index of the second gate insulation layer may be controlled in accordance with a nitrogen content of the second gate insulation layer.

In example embodiments, the first capacitor electrode may be disposed over the first gate insulation layer.

In example embodiments, the dielectric structure may include a portion of the second gate insulation layer.

In example embodiments, the second capacitor electrode may be disposed on the second gate insulation layer, and may be spaced apart from the first gate electrode along the second direction.

In example embodiments, the second capacitor electrode may contact an extended portion of the first source electrode.

In example embodiments, the second transistor may include a second active pattern disposed on the substrate in the opaque region, the first gate insulation layer being disposed on the second active pattern, a second gate electrode disposed on the first gate insulation layer, the second gate insulation layer being disposed on the second gate electrode, and a second source electrode and a second drain electrode contacting the second active pattern.

In example embodiments, the first capacitor electrode may be disposed on the first gate insulation layer, and is spaced apart from the second gate electrode along the second direction.

In example embodiments, the organic light emitting display device may additionally include an insulating interlayer covering the first gate electrode, the insulating interlayer including silicon oxide and a data line disposed on the insulating interlayer, the data line being spaced apart from the first source electrode along the second direction.

In example embodiments, the organic light emitting display device may additionally include an additional capacitor disposed on the capacitor.

In example embodiments, the additional capacitor may additionally include a first additional capacitor electrode positioned at a level same as that of the first gate electrode, an additional dielectric structure disposed on the first additional capacitor electrode, the additional dielectric structure including a portion of the insulating interlayer, and a second additional capacitor electrode disposed on the additional dielectric structure, the second additional capacitor electrode including a portion of the data line.

In example embodiments, the organic light emitting display device may additionally include an insulation layer disposed on the first transistor, the second transistor and the capacitor, the insulation layer having an opening extending to the transparent region, a first electrode disposed on the insulation layer, an organic light emitting structure disposed on the first electrode, and a second electrode disposed on the organic light emitting structure.

According to another embodiment, there is provided a method of manufacturing an organic light emitting display device having an opaque region and a transparent region. In the method, a first transistor may be formed on a substrate in the opaque region. A second transistor may be formed on the substrate in the opaque region. Here, the second transistor may be adjacent to the first transistor along a first direction. A capacitor may be formed on the substrate in the opaque region. Here, the capacitor may be adjacent to the first transistor along a second direction different from the first direction. For example, the capacitor may include a first capacitor electrode, a dielectric structure including silicon oxynitride and a second capacitor electrode.

In the formation of the first transistor according to example embodiments, a first active pattern may be formed on the substrate in the opaque region. A first gate insulation layer covering the first active pattern and extending into the transparent region may be formed. A second gate insulation layer including silicon oxynitride may be formed on the first gate insulation layer. Here, the second gate insulation layer may extend into the transparent region. A first gate electrode may be formed on the second gate insulation layer. A first source electrode contacting the first active pattern and extending along the second direction may be formed. A first drain electrode contacting the first active pattern may be formed. For example, the second gate insulation layer and the dielectric structure may be simultaneously formed, and the first gate electrode and the second capacitor electrode may be simultaneously formed.

In the formation of the second transistor according to example embodiments, a second active pattern may be formed on the substrate in the opaque region. The first gate insulation layer covering the second active pattern may be formed. A second gate electrode may be formed on the first gate insulation layer. The second gate insulation layer covering the second gate electrode may be formed. A second source electrode contacting the second active pattern may be formed. A second drain electrode contacting the second active pattern may be formed. For example, the second gate electrode and the first capacitor electrode may be simultaneously formed.

In the formation of the organic light emitting display device according to example embodiments, an insulating interlayer covering the first gate electrode may be additionally formed using silicon oxide. A data line may be additionally formed on the insulating interlayer. Here, the data line may be spaced apart from the first source electrode along the second direction.

In the formation of the organic light emitting display device according to example embodiments, an additional capacitor including a first additional capacitor electrode located at a level same as that of the first gate electrode, an additional dielectric structure disposed on the first additional capacitor electrode, the additional dielectric structure including a portion of the insulating interlayer, and a second additional capacitor electrode disposed on the additional dielectric structure, the second additional capacitor electrode including a portion of the data line may be additionally formed.

In example embodiments, the first transistor, the second transistor and the capacitor may be simultaneously formed.

In the formation of the organic light emitting display device according to example embodiments, an insulation layer may be additionally formed on the first transistor, the second transistor and the capacitor, the insulation layer having an opening extending to the transparent region. A first electrode may be additionally formed on the insulation layer. An organic light emitting structure may be additionally formed on the first electrode. A second electrode may be additionally formed on the organic light emitting structure.

According to example embodiments, the organic light emitting display device may include the substrate, the first transistor, the second transistor, the at least one capacitor, etc. The dielectric structure of the capacitor may include silicon oxynitride. Here, the dielectric constant and the refractive index of the dielectric structure may be adjusted in accordance with the nitrogen content therein, so that the capacitor may provide a sufficient capacitance for elements of the organic light emitting display device. In addition, when the dielectric structure extends from the opaque region to the transparent region, the transmittance of the transparent region may not be substantially reduced because a difference of refractive indices of adjacent layers may be minimized. Furthermore, the additional capacitor may be provided over the capacitor. In other words, the organic light emitting display device may have the configuration in which a plurality of capacitors is substantially vertically stacked. Thus, an area for the capacitors may be substantially reduced compared to the configuration in which the capacitors are disposed in parallel. As a result, the organic light emitting display device may ensure a more sufficient capacitance while increasing an area of the transparent region.

BRIEF DESCRIPTION OF THE DRAWINGS

Illustrative, non-limiting example embodiments will be more clearly understood from the following detailed description taken in conjunction containing the accompanying drawings.

DETAILED DESCRIPTION OF THE EMBODIMENTS

Hereinafter, organic light emitting display devices and methods of manufacturing organic light emitting display devices in accordance with example embodiments will be explained in detail with reference to the accompanying drawings.

Figure 1:
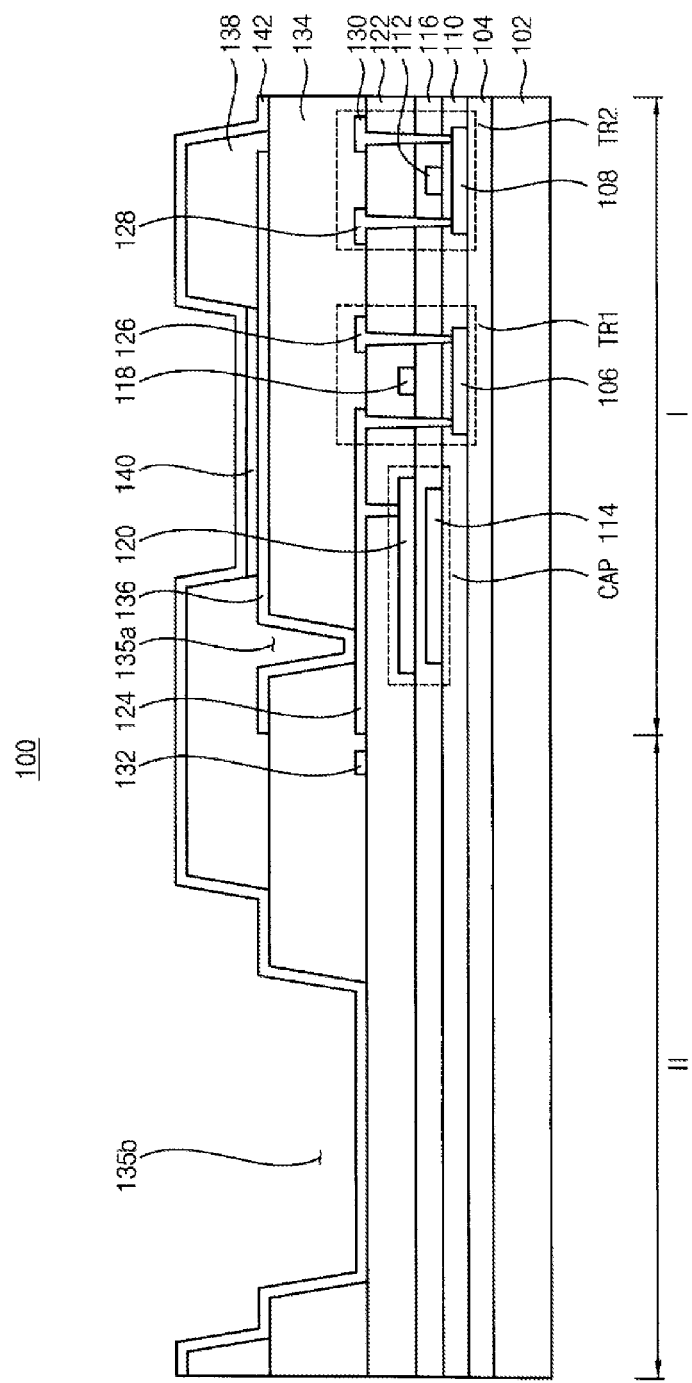
FIG. 1 is a cross sectional view illustrating an organic light emitting display device in accordance with example embodiments.

FIG. 1 is a cross sectional view illustrating an organic light emitting display device 100 in accordance with example embodiments.

Referring to FIG. 1, the organic light emitting display device 100 may include a substrate 102, a first transistor TR1, a second transistor TR2, a capacitor CAP, an organic light emitting structure 140, etc. The organic light emitting display device 100 may include an opaque region I and a transparent region II. While the organic light emitting display device 100 is in an ON state, an image may be displayed in the opaque region I. Further, while the organic light emitting display device 100 is in an OFF state, an image of an object positioned before and/or after the transparent region II of the organic light emitting display device 100 may be recognized by a user.

As illustrated in FIG. 1, the first transistor TR1, the second transistor TR2, the capacitor CAP and the organic light emitting structure 140 may be disposed in the opaque region I of the substrate 102. The second transistor TR2 may be located adjacent to the first transistor TR1 along a first direction. The capacitor CAP may be disposed adjacent to the first transistor TR1 along a second direction different from the first direction. For example, the second direction may be perpendicular to the first direction.

The substrate 102 may include a transparent insulation material. For example, the substrate 102 may include a glass substrate, a quartz substrate, a transparent resin substrate, etc. A buffer layer 104 may be disposed on the substrate 102. As illustrated in FIG. 1, the buffer layer 104 may extend from the opaque region I into the transparent region II. The buffer layer 104 may prevent the diffusion of metal atoms and/or impurities from the substrate 102. In addition, the buffer layer 104 may improve the surface flatness of the substrate 102 when the surface of the substrate 102 may be relatively irregular. For example, the buffer layer 104 may include a silicon compound such as silicon oxide. When the buffer layer 104 includes silicon oxide, an incident light from an outside to the transparent region II may pass through the buffer layer 104. Alternatively, the buffer layer 104 may be omitted in accordance with the material of the substrate 102, the surface condition of the substrate 102, etc.

The first transistor TR1 may be disposed on the buffer layer 104 in the opaque region I. As described above, when the buffer layer 104 is not provided on the substrate 102, the first transistor TR1 may be directly positioned on the substrate 102. The first transistor TR1 may include a first active pattern 106, a first gate insulation layer 110, a second gate insulation layer 116, a first gate electrode 118, a first source electrode 124, and a first drain electrode 126. For example, the first transistor TR1 may function as a driving transistor of the organic light emitting display device 100.

The second transistor TR2 may be disposed on the buffer layer 104 and may be adjacent to the first transistor TR1. The second transistor TR2 may include a second active pattern 108, the first gate insulation layer 110, a second gate electrode 112, a second source electrode 128, and a second drain electrode 130. For example, the second transistor TR2 may serve as a switching transistor of the organic light emitting display device 100.

The first and the second active patterns 106 and 108 may be positioned on the buffer layer 104 on the opaque region I. The second active pattern 108 may be spaced apart from the first active pattern 106 along the first direction. Each of the first and the second active patterns 106 and 108 may include a material containing silicon or oxide semiconductor.

The first gate insulation layer 110 may cover the first and the second active patterns 106 and 108, and also may extend into the transparent region II. For example, the first gate insulation layer 110 may include a silicon compound, a metal oxide, etc. In example embodiments, the first gate insulation layer 110 may include silicon oxide. In some example embodiments, the first gate insulation layer 110 may include a material substantially the same as that of the buffer layer 104. In this case, the first gate insulation layer 110 may have a transmittance substantially the same as that of the buffer layer 104 in the transparent region II.

The second gate electrode 112 may be disposed on the first gate insulation layer 110 so that the second gate electrode 112 may be partially overlapped with the second active pattern 108. The second gate electrode 112 may metal, alloy, metal nitride, conductive metal oxide, transparent conductive material, etc. These may be used alone or in a combination thereof.

In example embodiments, a first capacitor electrode 114 may be separated from the second gate electrode 112 on the first gate insulation layer 110 along the second direction by a predetermined distance. The first capacitor electrode 114 may include a material substantially the same as that of the second gate electrode 112. Alternatively, the first capacitor electrode 114 may include a material different from that of the second gate electrode 112.

The second gate insulation layer 116 may cover the second gate electrode 112 and the first capacitor electrode 114, and also may extend into the transparent region II. In example embodiments, the second gate insulation layer 116 may include silicon oxynitride, so that a dielectric constant of the second gate insulation layer 116 and a refractive index of the second gate insulation layer 116 may be controlled in accordance with a nitrogen content of silicon oxynitride included in second gate insulation layer 116. For example, the nitrogen content of silicon oxynitride in second gate insulation layer 116 may be less than about 25%. The second gate insulation layer 116 may have the dielectric constant less than about 5 and the refractive index less than about 1.7. Additionally, the second gate insulation layer 116 including silicon oxynitride may have a thickness substantially larger than that of the first gate insulation layer 110 including silicon oxide by about 1.2 times. Thus, when the second gate insulation layer 116 includes silicon oxynitride, the capacitor CAP may have a sufficient capacitance without substantially reducing a transmittance of the organic light emitting display device 100 even though the second gate insulation layer 116 is located in the transparent region II.

In example embodiments, threshold voltages of the first and the second transistors TR1 and TR2 may decrease, so that the first and the second transistors TR1 and TR2 may have improved electrical characteristics when the second gate insulation layer 116 includes silicon oxynitride. In addition, when a portion of the second gate insulation layer 116 functions as the dielectric structure of the capacitor CAP, the capacitance of the capacitor CAP may be sufficiently ensured because the capacitance of the second gate insulation layer 116 may be proportional to the dielectric constant of the second gate insulation layer 116. Further, the transmittance of the organic light emitting display device 100 may not decrease even though the second gate insulation layer 116 extends into the transparent region II because the difference between the adjacent layers may be minimized.

The first gate electrode 118 may be disposed on a portion of the first gate insulation layer 110 and the second gate insulation layer 116 under which the first active pattern 106 is located. The first gate electrode 118 may include a material substantially the same as a material of the second gate electrode 112 and a material of the first capacitor electrode 114. In some example embodiments, the first gate electrode 118, the second gate electrode 112, and the first capacitor electrode 114 may include different materials, respectively.

A second capacitor electrode 120 may be separated from the first gate electrode 118 on the second gate insulation layer 116 along the second direction by a predetermined distance. The second capacitor electrode 120 may extend into a portion of the transparent region II along the second direction. Thus, an additional capacitor (i.e., a second capacitor CAP2; see FIG. 2) may include the second capacitor electrode 120, an insulating interlayer 122 and the second drain electrode 130. The additional capacitor will be described below. The second capacitor electrode 120 may include a material substantially the same as that of the first gate electrode 118. Alternatively, the second capacitor electrode 120 may include a material different from that of the first gate electrode 118.

The insulating interlayer 122 may cover the first gate electrode 118 and the second capacitor electrode 120, and also may extend into the transparent region II. The insulating interlayer 122 may electrically insulate the first gate electrode 118 from the first source and drain electrodes 124 and 126. Additionally, the insulating interlayer 122 may electrically insulate the second gate electrode 112 from the second source and drain electrodes 128 and 130. In example embodiments, the organic light emitting display device 100 including the insulating interlayer 122 may have an improved transmittance compared with that of the conventional organic light emitting display device including an insulating interlayer of silicon nitride. In addition, the insulating interlayer 122 may include a material substantially the same as a material of the buffer layer 104 and a material of the first gate insulation layer 110, so that the insulating interlayer 122, the buffer layer 104 and the first gate insulation layer 110 may have substantially the same transmittance. As a result, an external light may efficiently pass through the insulating interlayer 122, the buffer layer 104 and the first gate insulation layer 110 in the transparent region II. Further, the insulating interlayer 122 may have a thickness substantially larger than that of the second gate insulation layer 116. For example, the insulating interlayer 122 may have an increased thickness substantially larger than those of other insulation layers (i.e., the buffer layer 104 and the first gate insulation layer 110) including silicon oxide by about 1.6 times. Therefore, a coupling effect generated between the first gate electrode 118 and the first source electrode 124, and a coupling effect generated between the first gate electrode 118 and the first drain electrode 126 may be reduced. Additionally, a coupling effect generated between the first source electrode 124 and the first drain electrode 126 may also be decreased.

When a portion of the insulating interlayer 122 belongs to an additional dielectric structure of the additional capacitor (i.e., the second capacitor CAP2), the organic light emitting display device 100 may have an increased capacitance substantially larger than the conventional organic light emitting display device including a capacitor. The capacitance of the capacitor CAP2 as described below may be sufficiently ensured compared with that of the conventional capacitor including the dielectric structure of silicon nitride because the insulating interlayer 122 may have a thickness substantially larger than the second gate insulation layer 116. Some example embodiments in which the dielectric structure of the second capacitor CAP2 includes the portion of the insulating interlayer 122 will be described below.

The first source electrode 124 and the first drain electrode 126 may be disposed on the insulating interlayer 122. The first source electrode 124 and the first drain electrode 126 may pass through a portion of the insulating interlayer 122, a portion of the second gate insulation layer 116, and a portion of the first gate insulating layer 110. Then, the first source electrode 124 and the first drain electrode 126 may contact the first active pattern 106. In example embodiments, since the first source electrode 124 may extend into the transparent region II, an extended portion of the first source electrode 124 in the transparent region II may pass through the insulating interlayer 122 to make contact with the second capacitor electrode 120. The first source electrode 124 and the first drain electrode 126 may include metal, alloy, metal nitride, conductive metal oxide, transparent conductive material, etc. These may be used alone or in a combination thereof.

The second source electrode 128 and the second drain electrode 130 may be disposed on the insulating interlayer 122. The second source electrode 128 and the second drain electrode 130 may pass through a portion of the insulating interlayer 122, a portion of the second gate insulation layer 116, and a portion of the first gate insulating layer 110. Then, the second source electrode 128 and the second drain electrode 130 may contact the second active pattern 108. The second source electrode 128 may include a material substantially the same as that of the first source electrode 124. Additionally, the second drain electrode 130 may include a material substantially the same as that of the first drain electrode 126.

An insulation layer 134 may be positioned on the insulating interlayer 122 to cover the first source electrode 124, the second source electrode 128, the first drain electrode 126, and the second drain electrode 130. In example embodiments, the insulation layer 134 may have an opening 135b extending to and exposing a portion of the transparent region II. Further, the opening 135b may extend to and expose an extended portion of the insulating interlayer 122 in the transparent region II. As illustrated in FIG. 1, the insulation layer 134 may additionally have a contact hole 135a partially exposing the extended portion of the first source electrode 124 in the transparent region II. For example, the insulation layer 134 may include an organic material or an inorganic material.

A first electrode 136 may be disposed on the insulation layer 134 to make contact with the extended portion of the first source electrode 124 in the transparent region II through the contact hole 135a. The first electrode 136 may include metal, alloy, metal nitride, conductive metal oxide.

A pixel defining layer 138 may be located on the first electrode 136. The pixel defining layer 138 may have an opening partially exposing the first electrode 136. For example, the pixel defining layer 138 may include an organic material or an inorganic material.

The organic light emitting structure 140 may be disposed on the exposed first electrode 136 through the opening of the pixel defining layer 138. The organic light emitting structure 140 may include a light emitting material for generating a red color of light, a green color of light or a blue color of light. Alternatively, the organic light emitting structure 140 may include a plurality of materials for generating a red color of light, a green color of light and/or a blue color of light, thereby finally emitting a white color of light.

A second electrode 142 may be disposed on the pixel defining layer 138 and the organic light emitting structure 140. The second electrode 142 may extend into the transparent region II to make contact with the portion of the insulating interlayer 122 through the opening 135b of the insulation layer 134. The second electrode 142 may include a transparent conductive material. For example, the second electrode 142 may include indium tin oxide, indium zinc oxide, zinc oxide, tin oxide, gallium oxide, indium oxide, etc. Thus, the transmittance of the transparent region II may not be reduced even though the second electrode 142 is positioned in the transparent region II. Alternatively, the second electrode 142 may include a material substantially the same as that of the first electrode 136.

As for the conventional organic light emitting display device, all of the transistors and the capacitors are located on the substrate in the opaque region, so that the transparent region may not have a sufficient area. Thus, the capacitor of the conventional organic light emitting display device may not have a sufficient capacitance. The organic light emitting display device according to example embodiments may include the opaque region I in which the first transistor TR1, the second transistor TR2 and at least one capacitor CAP may be located. The capacitor CAP may include the first capacitor electrode 114, the dielectric structure including silicon oxynitride (i.e., the portion of the second gate insulation layer 116), and the second capacitor electrode 120. Here, the threshold voltages of the first and the second transistors TR1 and TR2 may decrease to thereby improve the distribution of electrical characteristics of the first and the second transistors TR1 and TR2 when the second gate insulation layer 116 includes silicon oxynitride. Further, when the portion of the second gate insulation layer 116 serves as the dielectric structure of the capacitor CAP, the capacitance of the capacitor CAP may be sufficiently ensured because the capacitance of the capacitor CAP may be substantially proportional to the dielectric constant of the second gate insulation layer 116. Moreover, the transmittance of the organic light emitting display device 100 may not be reduced even though the second gate insulation layer 116 extends into the transparent region II because the difference of refractive indices of adjacent layers in the transparent region II may be minimized.

Figure 2:
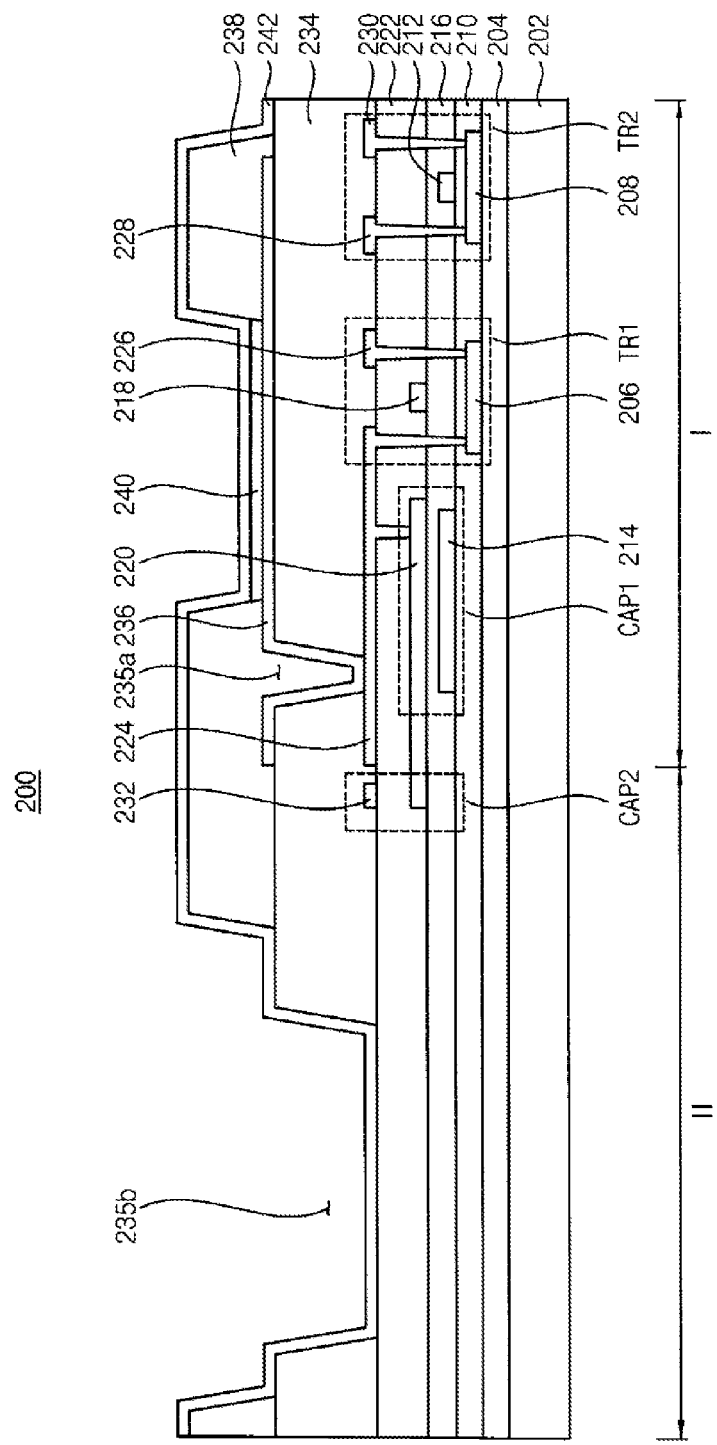
FIG. 2 is a cross-sectional view illustrating an organic light emitting display device in accordance with some example embodiments.

FIG. 2 is a cross-sectional view illustrating an organic light emitting display device in accordance with some example embodiments. The organic light emitting display device 200 illustrated in FIG. 2 may have a configuration substantially the same as or similar to the organic light emitting display device 100 described with reference to FIG. 1 except a second additional capacitor CAP2. More particularly, the elements 202, 204, 206, 208, 210, 212, 214, 216, 218, 222, 224, 226, 228, 230, 232, 234, 236, 238, 240, 242, 235a, 235b of the organic light emitting display device 200 illustrated in FIG. 2 may be the same as or similar to the elements 102, 104, 106, 108, 110, 112, 114, 116, 118, 122, 124, 126, 128, 130, 132, 134, 136, 138, 140, 142, 135a, 135b of the organic light emitting display device 100 illustrated in FIG. 1, respectively.

Referring to FIG. 2, the second additional capacitor CAP2 may include a first additional capacitor electrode 220, an additional dielectric structure, and a second additional capacitor electrode. Here, the second additional capacitor electrode may include a portion of a data line 232.

The first additional capacitor electrode 220 may be located on the second gate insulation layer 216, and may extend into a portion of the transparent region II along the second direction. Thus, the second additional capacitor CAP2 may include the first additional capacitor electrode 220, portions of the insulating interlayer 222, and the portion of the data line 232. In other words, the first additional capacitor electrode 220 may serve as a lower electrode of the additional capacitor CAP2, and also, as illustrated in FIG. 2, the first additional capacitor electrode 220 may serve as the upper electrode of the capacitor CAP1. Therefore, the organic light emitting display device 200 may have the configuration in which the capacitor CAP1 and the additional capacitor CAP2 may be substantially vertically stacked. Here, the capacitor CAP1 and the additional capacitor CAP2 may share the first capacitor electrode 220. Thus, the capacitors CAP1 and CPA2 may occupy a substantially small area in comparison with the configuration in which the capacitors are disposed in parallel. As a result, the transparent region II of the organic light emitting display device 200 may have a substantially increased area.

As described above, the portion of the insulating interlayer 222 including silicon oxide may serve as the additional dielectric structure of the additional capacitor CAP2. For example, the insulating interlayer 222 according to example embodiments may have an increased thickness substantially larger than those of other insulation layers including silicon oxide by about 1.6 times. Accordingly when the additional dielectric structure of the additional capacitor includes the portion of the insulating interlayer 122, the organic light emitting display device 200 may have a more increased capacitance compared to the organic light emitting display device that includes one capacitor only. In addition, the insulating interlayer 222 may include a material substantially the same as that of the buffer layer 204 and that of the first gate insulation layer 210, so that the insulating interlayer 222, the buffer layer 204 and the first gate insulation layer 210 may have substantially the same transmittance. Therefore, an external light may efficiently pass through the insulating interlayer 222, the buffer layer 204 and the first gate insulation layer 210 in the transparent region II.

As described above, the insulating interlayer 222 including silicon oxide may have an increased thickness substantially larger than that of other insulating interlayers including silicon oxide by about 1.6 times. Thus, increased thickness of the insulating interlayer 222 may prevent electrostatic discharges generated among the first gate electrode 218, the first source electrode 224 and the first drain electrode 226, and among the first source electrode 224 and the first drain electrode 226. Therefore, the organic light emitting display device 200 may have an improved reliability. As a result, when the portion of the insulating interlayer 222 may serve as the additional dielectric structure of the additional capacitor CAP2, the organic light emitting display device 200 may provide a more sufficient capacitance without substantially reducing the transmittance of the organic light emitting display device 200 even through the insulating interlayer 222 extends into the transparent region II.

FIGS. 3 to 10 are cross sectional views illustrating a method of manufacturing an organic light emitting display device in accordance with example embodiments. The method illustrated in FIGS. 3 to 10 may provide an organic light emitting display device having a configuration substantially the same as or similar to that of the organic light emitting display device 100 described with reference to FIG. 1, however, the organic light emitting display device 100 or 200 illustrated in FIG. 1 or FIG. 2 may be manufactured by obviously modifying some processes such as a deposition process, an etching process, etc.

Figure 3:
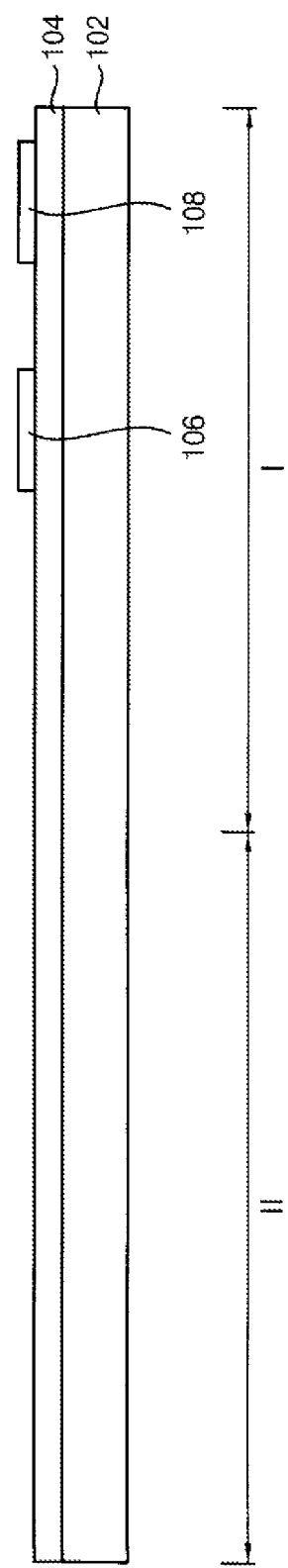
FIGS. 3, 4, 5, 6, 7, 8, 9 and 10 are cross sectional views illustrating a method of manufacturing an organic light emitting display device in accordance with example embodiments.

Referring to FIG. 3, a buffer layer 104 may be formed on a substrate 102. The substrate 102 may be formed using a transparent insulation material. The buffer layer 104 may be formed using silicon oxide, so that a transmittance of a transparent region II may not be reduced even though the buffer layer 104 is formed from an opaque region I into the transparent region II.

A first active pattern 106 and a second active pattern 108 may be formed on the buffer layer 104. As illustrated in FIG. 3, the first active pattern 106 and the second active pattern 108 may be separated from each other by a predetermined distance in the opaque region I.

Figure 4:
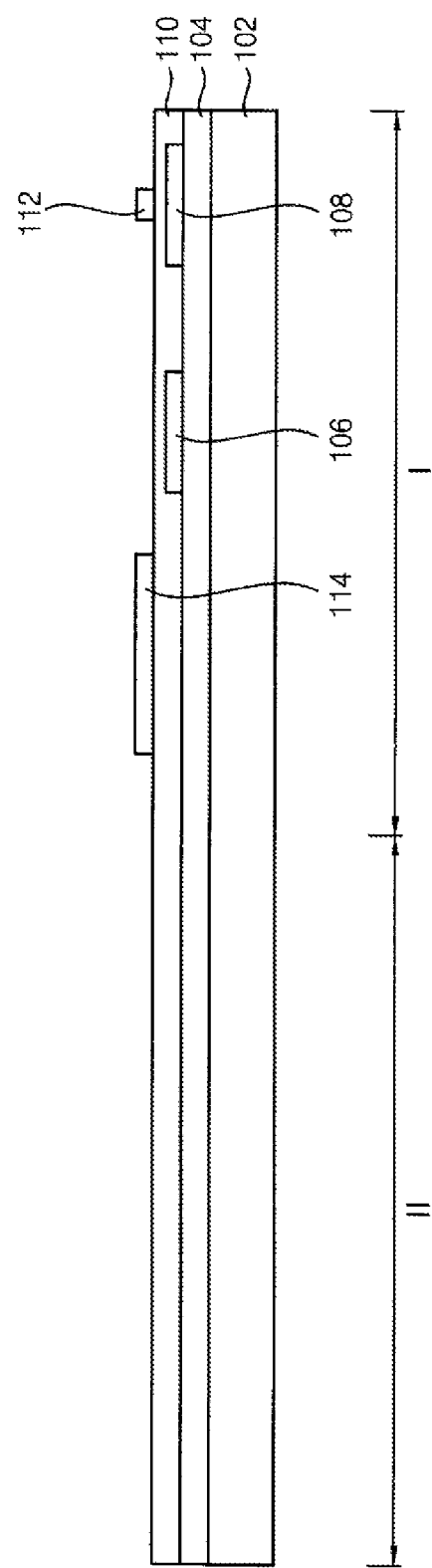

Referring to FIG. 4, a first gate insulation layer 110 may be formed on the buffer layer 104 to cover the active pattern 106 and the second active pattern 108. The first gate insulation layer 110 may extend into the transparent region II. In other words, the first gate insulation layer 110 may be continuously disposed on the buffer layer 104 from the opaque region I to the transparent region II. In example embodiments, the transmittance of the transparent region II may not be reduced even though the first gate insulation layer 110 is disposed into the transparent region II because the first gate insulation layer 110 may be formed using silicon oxide.

A second gate electrode 112 and a first capacitor electrode 114 may be formed on the first gate insulation layer 110. The second gate electrode 112 and the first capacitor electrode 114 may be positioned in the opaque region I. For example, the second gate electrode 112 may be overlapped over the second active pattern 108 by interposing the first gate insulation layer 110 therebetween. The first capacitor electrode 114 and the second active pattern 108 may be separated from each other by a predetermined distance along a second direction. The second gate electrode 112 may include a material substantially the same as that of the first capacitor electrode 114. For example, each of the second gate electrode 112 and the first capacitor electrode 114 may be formed using metal, alloy, metal nitride, conductive metal oxide, transparent conductive material, etc. In addition, the second gate electrode 112 and the first capacitor electrode 114 may be simultaneously formed by an etching process using one mask. Alternatively, the second gate electrode 112 may include a material different from that of the first capacitor electrode 114.

Figure 5:
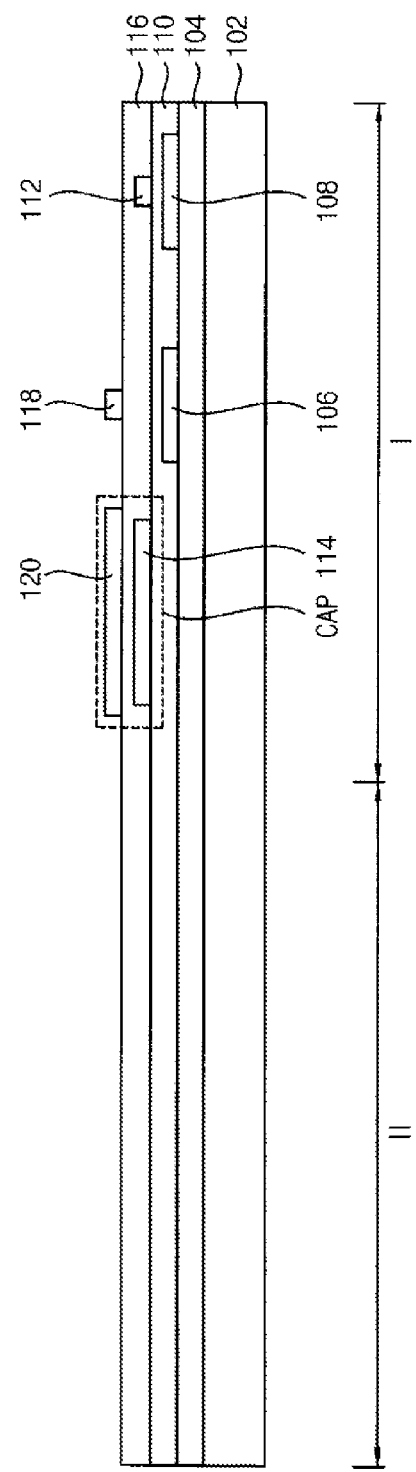

Referring to FIG. 5, a second gate insulation layer 116 may be formed on the first gate insulation layer 110 to cover the first capacitor electrode 114 and the second gate electrode 112. The second gate insulation layer 116 may be positioned on the first gate insulation layer 110 in the opaque region I and the transparent region II. In example embodiments, the second gate insulation layer 116 may be formed using silicon oxynitride. In this case, a dielectric constant and a refractive index of the second gate insulation layer 116 may be controlled in accordance with a nitrogen content of silicon oxide included in the second gate insulation layer 116, so that the difference of refraction indices of adjacent layers may be minimized even though the second gate insulation layer 116 is formed in the transparent region II. Thus, a capacitance of a capacitor CAP may be sufficiently ensured without substantially reducing a transmittance of the organic light emitting display device 100. Further, the second gate insulation layer 116 may have an increased thickness substantially larger than that of the first gate insulation layer 110 including silicon oxide by about 1.2 times. Accordingly, when a portion of the second gate insulation layer 116 serves as a dielectric structure of the capacitor CAP, the organic light emitting display device 100 may have a sufficient capacitance without substantially decreasing the transmittance of the organic light emitting display device 100.

Referring still to FIG. 5, a first gate electrode 118 may be formed on a portion of the second gate insulation layer 116 under which the first active pattern 106 is located. A second capacitor electrode 120 may be separated from the first gate electrode 118 by a predetermined distance along the second direction. As illustrated in FIG. 5, the first gate electrode 118 and the second capacitor electrode 120 may be positioned in the opaque region I. Each of the first gate electrode 118 and the second capacitor electrode 120 may include metal, alloy, metal nitride, conductive metal oxide, transparent conductive material, etc. In addition, the first gate electrode 118 and the second capacitor electrode 120 may be simultaneously formed by one etching process. As the formation of the second capacitor electrode 120, the capacitor CAP may be provided in the opaque region I. The capacitor CAP may include the first capacitor electrode 114, the dielectric structure including the portion of the second gate insulation layer 116, and the second capacitor electrode 120.

Figure 6:
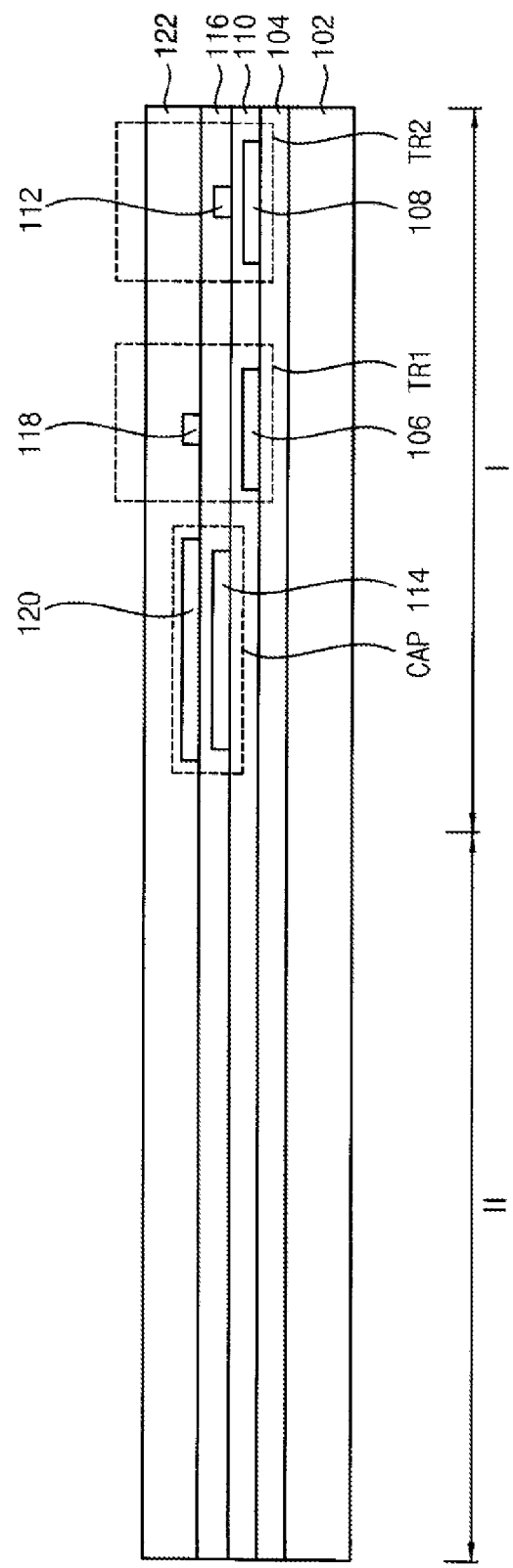

Referring to FIG. 6, an insulating interlayer 122 may be formed on the second gate insulation layer 116 to cover the first gate electrode 118 and the second capacitor electrode 120. The insulating interlayer 122 may extend into the transparent region II to sufficiently cover the first gate electrode 118 and the second capacitor electrode 120. In example embodiments, the insulating interlayer 122 may be formed using silicon oxide, such that the transmittance of the transparent region II may not be substantially reduced even though the insulating interlayer 122 is positioned in the transparent region II. Further, the insulating interlayer 122 may be formed using silicon oxide, so that the organic light emitting display device 100 may have an increased transmittance larger than that of the conventional organic light emitting display device including the insulating interlayer of silicon nitride. Moreover, the insulating interlayer 122 may have a thickness relatively larger than the second gate insulation layer 116. For example, the insulating interlayer 122 according to example embodiments may have an increased thickness substantially larger than those of other insulation layers of silicon oxide by about 1.6 times. Such insulating interlayer 122 may effectively insulate between a first source electrode 124 and the first gate electrode 118, between a second source electrode 128 and the second gate electrode 112, and between a second drain electrode 130 and the second gate electrode 112. Therefore, the organic light emitting display device 100 may have an enhanced reliability because of the insulating interlayer 122 efficiently insulating the electrodes of the organic light emitting display device 100.

Figure 7:
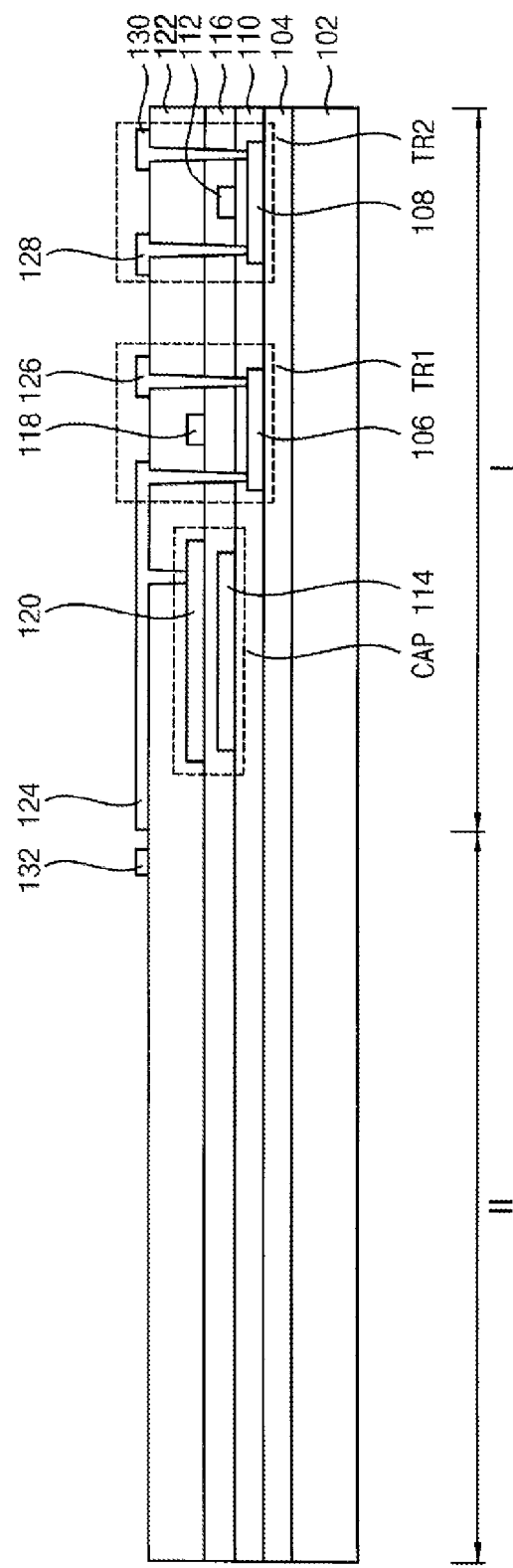

Referring to FIG. 7, the first source electrode 124 and the first drain electrode 126 may be formed on the insulating interlayer 122. The first source electrode 124 and the first drain electrode 126 may contact portions of the first active pattern 106 through contact holes provided through a portion of the insulating interlayer 122 and portions of the first and the second gate insulation layers 110 and 116. Simultaneously, the second source electrode 128 and the second drain electrode 130 may be formed on the insulating interlayer 122. The second source electrode 128 and the second drain electrode 130 may contact portions of the second active pattern 108 through contact holes formed through the insulating interlayer 122 and the first and the second gate insulation layers 110 and 116. In example embodiments, the first source electrode 124 may extend in the opaque region I along the second direction. Thus, the first source electrode 124 may contact the second capacitor electrode 120 through contact holes provided through a portion of the insulating interlayer 122. As illustrated in FIG. 7, a data line 132 may be formed to be spaced apart from the first source electrode 124 by a predetermined distance in the transparent region II. Each of the first and the second source electrodes 124 and 128, the first and the second drain electrodes 126 and 130, and the data line 132 may be formed using metal, alloy, metal nitride, conductive metal oxide, a material having a transmittance, etc.

Figure 8:
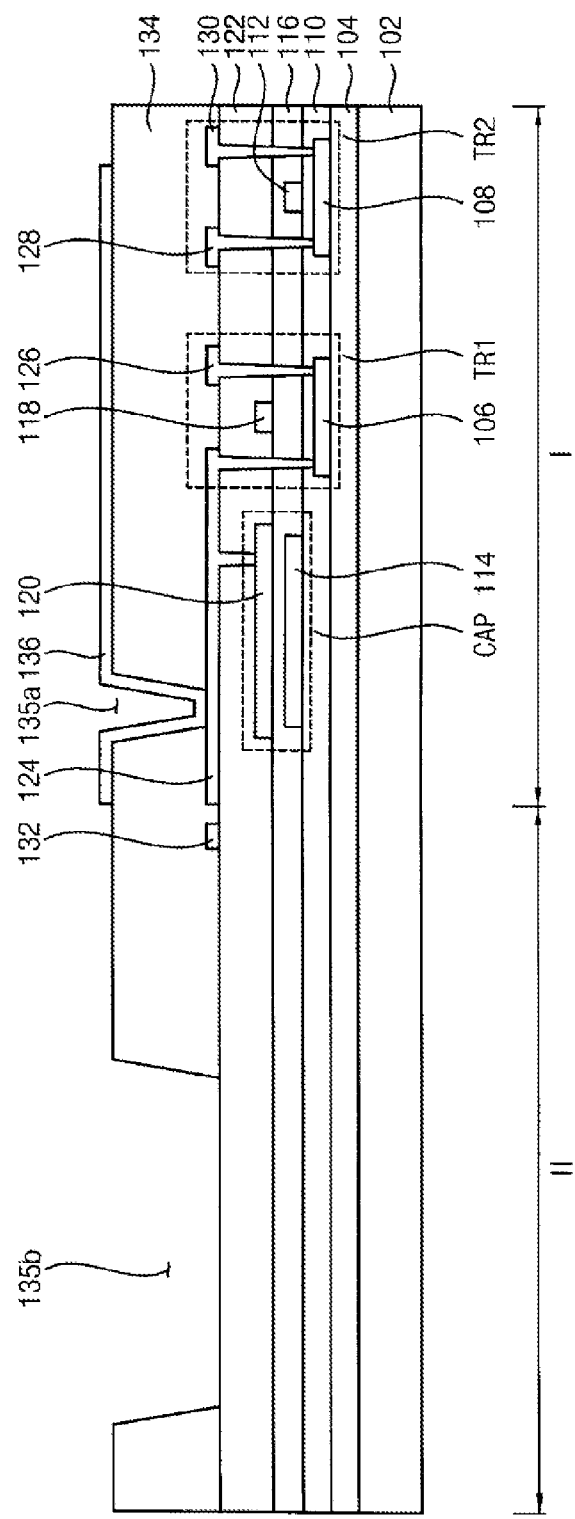

Referring to FIG. 8, an insulation layer 134 may be formed on the insulating interlayer 122 to cover the first and the second source electrodes 124 and 128, and the first and the second drain electrodes 126 and 130. In example embodiments, the insulation layer 134 may have an opening 135b extending to and partially exposing the insulating interlayer 122 in the transparent region II. Then, a first electrode 136 may be formed on the insulation layer 134. The first electrode 136 may be formed using metal, alloy, metal nitride, conductive metal oxide, transparent conductive material, etc.

Figure 9:
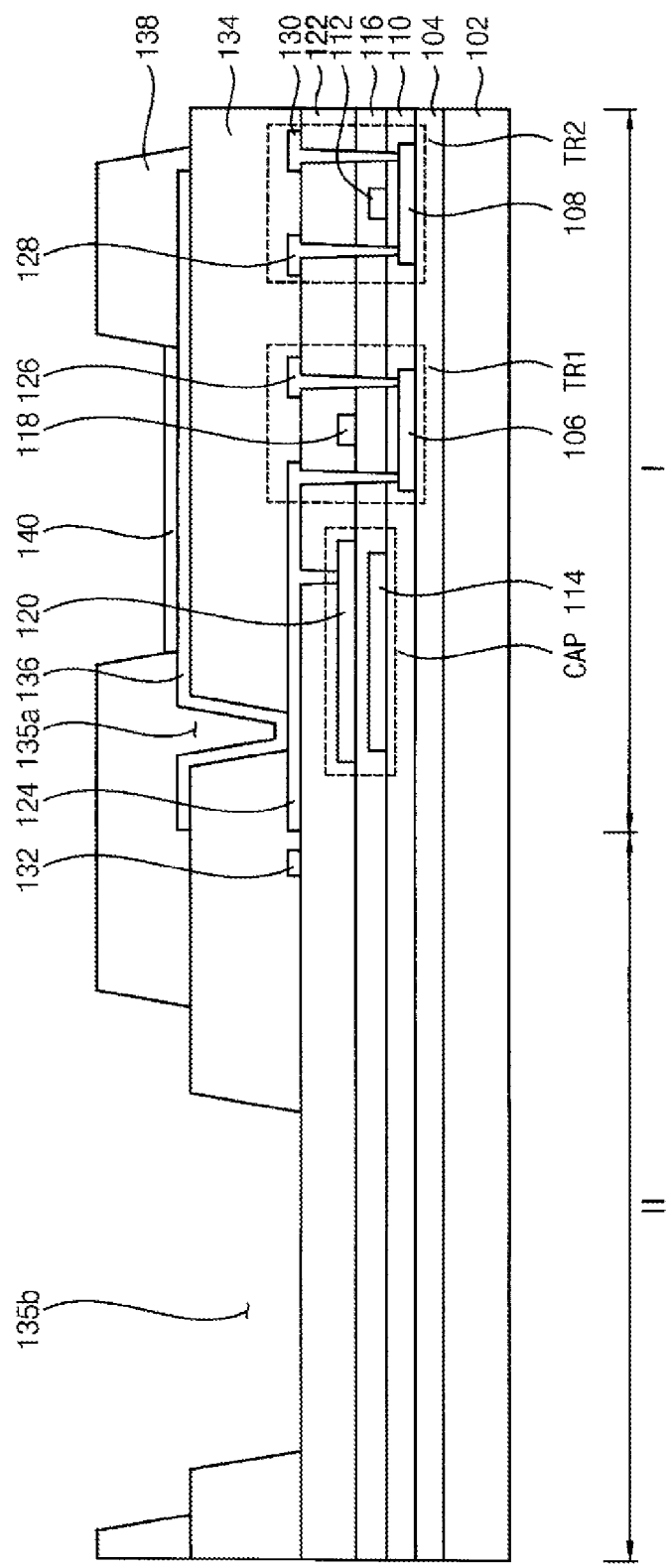

Referring to FIG. 9, a pixel defining layer 138 may be formed on the first electrode 136 and the insulation layer 134. The pixel defining layer 138 may include a pixel opening partially exposing the first electrode 136. For example, the pixel defining layer 138 may be formed using an organic material or an inorganic material.

Referring still to FIG. 9, an organic light emitting structure 140 may be formed on the first electrode 136 exposed by the pixel opening of the pixel defining layer 138. In example embodiments, the organic light emitting structure 140 may have a multi-layered configuration that includes an organic light emitting layer (EL), a hole injection layer (HIL), a hole transfer layer (HTL), an electron transfer layer (ETL), an electron injection layer (EIL), etc.

Figure 10:
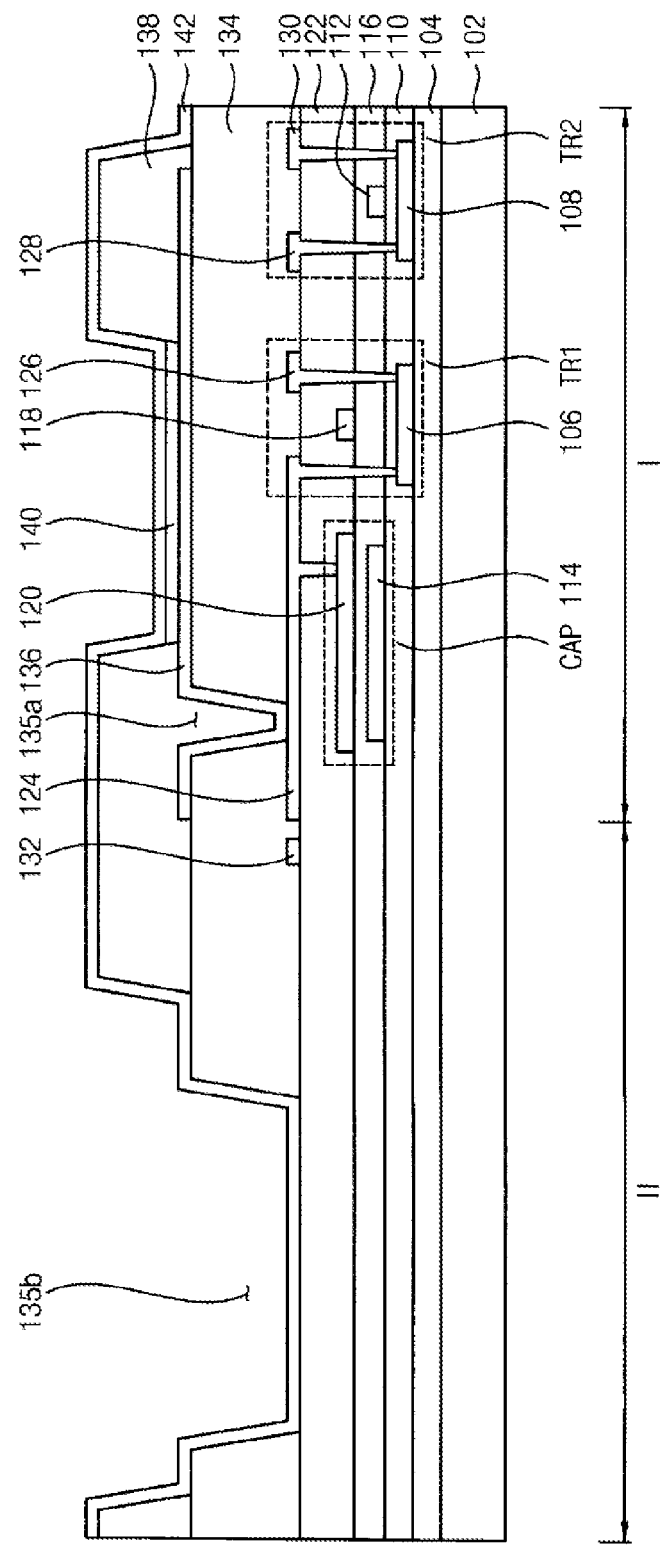

Referring to FIG. 10, a second electrode 142 may be formed on the pixel defining layer 138 and the organic light emitting structure 140. For example, the second electrode 142 may be formed using a material substantially the same as that of the first electrode 136. Alternatively, the second electrode 142 may be formed using a material different from that of the first electrode 136.

Example embodiments may be employed in any electronic device including a transparent organic light emitting display device. For example, the transparent organic light emitting display device according to embodiments may be used in a refrigerator for business, a smart window, a transparent tablet, a head-up display device, a wearable display device, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An organic light emitting display device having an opaque region and a transparent region, which comprises:
    a substrate;
    a first transistor disposed on the substrate in the opaque region;
    a second transistor disposed on the substrate in the opaque region, the second transistor being adjacent to the first transistor; and
    a capacitor disposed on the substrate in the opaque region, the capacitor being adjacent to the first transistor,
    wherein the capacitor includes a first capacitor electrode, a dielectric structure including silicon oxynitride and a second capacitor electrode,
    wherein the first transistor comprises:
    a first active pattern disposed on the substrate in the opaque region;
    a first gate insulation layer disposed on the first active pattern, the first gate insulation layer extending into the transparent region;
    a second gate insulation layer including silicon oxynitride disposed on the first gate insulation layer, the second gate insulation layer extending into the transparent region;
    a first gate electrode disposed on the second gate insulation layer;
    a first source electrode contacting the first active pattern, the first source electrode extending along a first direction parallel to the substrate; and
    a first drain electrode contacting the first active pattern, wherein the second transistor comprises:
    a second active pattern disposed on the substrate in the opaque region;
    the first gate insulation layer being disposed on the second active pattern;
    a second gate electrode disposed on the first gate insulation layer;
    the second gate insulation layer being disposed on the second gate electrode; and
    a second source electrode and a second drain electrode contacting the second active pattern.

2. The organic light emitting display device of claim 1, wherein the first capacitor electrode is disposed over the first gate insulation layer.

3. The organic light emitting display device of claim 1, wherein the dielectric structure includes a portion of the second gate insulation layer.

4. The organic light emitting display device of claim 1, wherein the second capacitor electrode is disposed on the second gate insulation layer, and is spaced apart from the first gate electrode along the first direction.

5. The organic light emitting display device of claim 1, wherein the second capacitor electrode contacts an extended portion of the first source electrode.

6. The organic light emitting display device of claim 1, wherein the first capacitor electrode is disposed on the first gate insulation layer, and is spaced apart from the second gate electrode along the first direction.

7. The organic light emitting display device of claim 1, further comprising:
    an insulating interlayer covering the first gate electrode, the insulating interlayer including silicon oxide; and
    a data line disposed on the insulating interlayer, the data line being spaced apart from the first source electrode along the first direction.

8. The organic light emitting display device of claim 7, further comprising:
    an additional capacitor disposed on the capacitor.

9. The organic light emitting display device of claim 8, wherein the additional capacitor comprises:
    a first additional capacitor electrode positioned at a level same as that of the first gate electrode;
    an additional dielectric structure disposed on the first additional capacitor electrode, the additional dielectric structure including a portion of the insulating interlayer; and
    a second additional capacitor electrode disposed on the additional dielectric structure, the second additional capacitor electrode including a portion of the data line.

10. The organic light emitting display device of claim 1, further comprising:
    an insulation layer disposed on the first transistor, the second transistor and the capacitor, the insulation layer having an opening extending to the transparent region;
    a first electrode disposed on the insulation layer;
    an organic light emitting structure disposed on the first electrode; and
    a second electrode disposed on the organic light emitting structure.

11. A method of manufacturing an organic light emitting display device including an opaque region and a transparent region, which comprises:
    forming a first transistor on a substrate in the opaque region;

forming a second transistor on the substrate in the opaque region, the second transistor being adjacent to the first transistor; and forming a capacitor on the substrate in the opaque region, the capacitor being adjacent to the first transistor, wherein the capacitor includes a first capacitor electrode, a dielectric structure including silicon oxynitride and a second capacitor electrode, wherein forming the first transistor comprises:

forming a first active pattern on the substrate in the opaque region;

forming a first gate insulation layer covering the first active pattern and extending into the transparent region;

forming a second gate insulation layer including silicon oxynitride on the first gate insulation layer, the second gate insulation layer extending into the transparent region;

forming a first gate electrode on the second gate insulation layer;

forming a first source electrode contacting the first active pattern and extending along a first direction parallel to the substrate; and forming a first drain electrode contacting the first active pattern, wherein the second gate insulation layer and the dielectric structure are simultaneously formed, and the first gate electrode and the second capacitor electrode are simultaneously formed, wherein forming the second transistor comprises:

forming a second active pattern on the substrate in the opaque region;

forming the first gate insulation layer covering the second active pattern;

forming a second gate electrode on the first gate insulation layer;

forming the second gate insulation layer covering the second gate electrode;

forming a second source electrode contacting the second active pattern; and forming a second drain electrode contacting the second active pattern, wherein the second gate electrode and the first capacitor electrode are simultaneously formed.

12. The method of claim 11, further comprising:

forming an insulating interlayer covering the first gate electrode using silicon oxide; and forming a data line on the insulating interlayer, the data line being spaced apart from the first source electrode along the first direction.

13. The method of claim 12, further comprising:

forming an additional capacitor including a first additional capacitor electrode located at a level same as that of the first gate electrode, an additional dielectric structure disposed on the first additional capacitor electrode, the additional dielectric structure including a portion of the insulating interlayer, and a second additional capacitor electrode disposed on the additional dielectric structure, the second additional capacitor electrode including a portion of the data line.

14. The method of claim 11, wherein the first transistor, the second transistor and the capacitor are simultaneously formed.

15. The organic light emitting display device of claim 1, wherein a nitrogen content of the silicon oxynitride in the dielectric structure is less than 25%.

* * * * *